(12) United States Patent
Lee et al.

(10) Patent No.: US 9,165,721 B2
(45) Date of Patent: Oct. 20, 2015

(54) INKJET-PRINTED FLEXIBLE ELECTRONIC COMPONENTS FROM GRAPHENE OXIDE

(71) Applicants: THE TRUSTEES OF THE STEVENS INSTITUTE OF TECHNOLOGY, Hoboken, NJ (US); THE UNITED STATES OF AMERICA, AS REPRESENTED BY THE SECRETARY OF THE ARMY, Washington, DC (US)

(72) Inventors: Woo Young Lee, Ridgewood, NJ (US); Linh Le, New York, NY (US); De Kong, Hoboken, NJ (US); Matthew Henderson Ervin, Clarksville, MD (US); James L. Zunino, III, Booton Township, NJ (US); Brian E. Fuchs, Hackettstown, NJ (US)

(73) Assignees: THE TRUSTEES OF THE STEVENS INSTITUTE OF TECHNOLOGY, Hoboken, NJ (US); THE UNITED STATES OF AMERICA, as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 14/327,753

(22) Filed: Jul. 10, 2014

(65) Prior Publication Data
US 2014/0334065 A1      Nov. 13, 2014

Related U.S. Application Data

(62) Division of application No. 13/301,124, filed on Nov. 21, 2011, now Pat. No. 8,810,996.

(60) Provisional application No. 61/416,062, filed on Nov. 22, 2010.

(51) Int. Cl.
*H01G 9/00*       (2006.01)
*H01G 11/42*      (2013.01)
(Continued)

(52) U.S. Cl.
CPC ............... *H01G 11/42* (2013.01); *H01G 11/36* (2013.01); *H01G 11/48* (2013.01); *H01G 11/80* (2013.01);
(Continued)

(58) Field of Classification Search
USPC ......... 361/502, 503–504, 303–305, 509–512, 361/516–519, 311–313
See application file for complete search history.

(56) References Cited

U.S. PATENT DOCUMENTS

| | | | |
|---|---|---|---|
| 4,772,924 A | 9/1988 | Bean et al. |
| 4,903,101 A | 2/1990 | Maserjian |

(Continued)

FOREIGN PATENT DOCUMENTS

| | | |
|---|---|---|
| WO | 2012073998 A1 | 6/2013 |
| WO | 2013119295 | 8/2013 |

OTHER PUBLICATIONS
U.S. Appl. No. 14/019,799, filed Sep. 6, 2013.
(Continued)

*Primary Examiner* — Nguyen T Ha
(74) *Attorney, Agent, or Firm* — Greenberg Traurig, LLP

(57) ABSTRACT

An electrical component includes an inkjet-printed graphene electrode. Graphene oxide flakes are deposited on a substrate in a graphene oxide ink using an inkjet printer. The deposited graphene oxide is thermally reduced to graphene. The electrical properties of the electrode are comparable to those of electrodes made using activated carbon, carbon nanotubes or graphene made by other methods. The electrical properties of the graphene electrodes may be tailored by adding nanoparticles of other materials to the ink to serve as conductivity enhancers, spacers, or to confer pseudocapacitance. Inkjet-printing can be used to make graphene electrodes of a desired thickness in preselected patterns. Inkjet printing can be used to make highly-transparent graphene electrodes. Inkjet-printed graphene electrodes may be used to fabricate double-layer capacitors that store energy by nanoscale charge separation at the electrode-electrolyte interface (i.e., "supercapacitors").

4 Claims, 6 Drawing Sheets

(51) Int. Cl.
| | |
|---|---|
| H01G 11/36 | (2013.01) |
| H01G 11/86 | (2013.01) |
| H05K 1/16 | (2006.01) |
| H05K 3/12 | (2006.01) |
| H01G 11/48 | (2013.01) |
| H01G 11/80 | (2013.01) |
| H05K 1/03 | (2006.01) |
| H05K 1/09 | (2006.01) |

(52) U.S. Cl.
CPC .............. *H01G 11/86* (2013.01); *H05K 1/162* (2013.01); *H05K 3/125* (2013.01); *H05K 1/0393* (2013.01); *H05K 1/092* (2013.01); *H05K 2201/0323* (2013.01); *Y02E 60/13* (2013.01)

(56) References Cited

U.S. PATENT DOCUMENTS

| | | | |
|---|---|---|---|
| 5,238,868 A | 8/1993 | Elman et al. | |
| 6,813,064 B2 | 11/2004 | John et al. | |
| 7,147,674 B1 * | 12/2006 | Zhong et al. | 29/25.03 |
| 7,167,355 B2 | 1/2007 | Chen | |
| 7,217,951 B2 | 5/2007 | Krishna et al. | |
| 7,387,253 B1 | 6/2008 | Parker et al. | |
| 7,550,755 B2 | 6/2009 | Balkenende et al. | |
| 7,553,584 B2 * | 6/2009 | Chiang et al. | 429/209 |
| 7,628,928 B2 | 12/2009 | Guerra | |
| 7,830,926 B1 | 11/2010 | Kim | |
| 7,852,613 B2 | 12/2010 | Ma et al. | |
| 8,098,482 B2 | 1/2012 | Clelland et al. | |
| 8,105,928 B2 | 1/2012 | Lin et al. | |
| 8,168,326 B2 * | 5/2012 | Chiang et al. | 429/209 |
| 8,206,469 B2 | 6/2012 | Chiang et al. | |
| 8,278,757 B2 | 10/2012 | Crain et al. | |
| 8,455,842 B2 | 6/2013 | Zhang et al. | |
| 8,472,162 B2 * | 6/2013 | Lang | 361/502 |
| 8,580,132 B2 | 11/2013 | Lin et al. | |
| 8,697,485 B2 | 4/2014 | Crain et al. | |
| 8,808,860 B2 | 8/2014 | Kim et al. | |
| 8,810,996 B2 | 8/2014 | Lee et al. | |
| 2003/0012249 A1 | 1/2003 | Eisenbeiser | |
| 2007/0215855 A1 | 9/2007 | Kang | |
| 2011/0052813 A1 | 3/2011 | Ho et al. | |
| 2012/0128983 A1 | 5/2012 | Yoon | |
| 2012/0244358 A1 | 9/2012 | Lock | |
| 2012/0270205 A1 | 10/2012 | Patel et al. | |
| 2013/0264011 A1 | 10/2013 | Lin et al. | |
| 2013/0264192 A1 | 10/2013 | Lin et al. | |
| 2013/0264193 A1 | 10/2013 | Lin et al. | |
| 2013/0266729 A1 | 10/2013 | Lin et al. | |
| 2014/0103298 A1 | 4/2014 | Lee et al. | |
| 2014/0127584 A1 | 5/2014 | Kim et al. | |
| 2014/0205841 A1 | 7/2014 | Qiu et al. | |
| 2014/0231002 A1 | 8/2014 | Patil et al. | |

OTHER PUBLICATIONS

U.S. Appl. No. 14/185,350, filed Feb. 20, 2014.
U.S. Appl. No. 14/156,070, filed Jan. 15, 2014.
Zhou et al., Controlled Synthesis of Large-Area and Patterned Electrochemically Reduced Graphene Oxide Films, Chemistry European Journal, 15, 6116-6120, (2009).
A Communication for U.S. Appl. No. 14/053,232, mailed Nov. 6, 2014.
An et al., Optical and Sensing Properties of 1-Pyrenecarboxylic Acid-Functionalized Graphene Films Laminated on Polydimethylsiloxane Membrane, American Chemical Society, vol. 5, No. 2, (2011), pp. 1003-1011.
Le et al., Graphene supercapacitor electrodes fabricated by inkjet printing and thermal reduction of graphene oxide, Electrochemistry Communications, vol. 13, (2011), pp. 355-358.
Le et al., Inkjet-Printed Graphene for Flexible Micro-Supercapacitors, IEEE International Conference on Nanotechnology, Aug. 15-18, 2011, Portland, Oregon, USA, pp. 67-71.
Huang et al., Graphene-Based Conducting Inks for Direct Inkjet Printing of Flexible Conductive Patterns and Their Applications in Electric Circuits and Chemical Sensors, Nano Res. (2011) 9 pages.
Jacoby, Graphene Moves Toward Applications, www.cen-online.org, Nov. 21, 2011, pp. 10-15.
Akhavan, O. et al., Toxicity of graphene and graphene oxide nanowalls against bacteria, ACS Nano, 4 (2010) 5731-5736.
Bolotin, K. et al., Ultrahigh electron mobility in suspended graphene; Solid State Communications, 146 (2008) 351-355.
Bourlinos, A. et al., Graphite oxide: Chemical reduction to graphite and surface modification with primary aliphatic amines and amino acids, Langmuir, 19 (2003) 6050-6055.
Chen, Z. et al., Three-dimensional flexible and conductive interconnected graphene networks grown by chemical vapour deposition, Nature Materials, 10 (2011) 424-428.
Coleman, J.N., Liquid-Phase Exfoliation of Nanotubes and Graphene, Advanced Functional Materials, 19 (2009) 3680-3695.
Cote, L. et al., Flash Reduction and Patterning of Graphite Oxide and Its Polymer Composite, Journal of the American Chemical Society, 131 (2009) 11027-11032.
Dikin, D. et al., Preparation and characterization of graphene oxide paper, Nature, 448 (2007) 457-460.
Dreyer, D. et al., The chemistry of graphene oxide, Chemical Society Reviews, 39 (2010) 228-240.
Dreyer, D. et al., From Conception to Realization: An Historical Account of Graphene and Some Perspectives for Its Future, Angewandte Chemie International Edition, 49 (2010) 9336-9344.
El-Kady, M. et al., "Laser Scribing of High-Performance and Flexible Graphene-Based Electrochemical Capacitors," Science, vol. 335, No. 6074, pp. 1326-1330, Mar. 2012.
Gao, X. et al., Hydrazine and thermal reduction of graphene oxide: Reaction mechanisms, product structures, and reaction design, Journal of Physical Chemistry C, 114 (2010) 832-842.
Hong, A. et al., "Graphene Flash Memory," ACS Nano 5 (10), 7812-7817 (2011).
Liu, C. et al., Graphene-Based Supercapacitor with an Ultrahigh Energy Density; NanoLetters, 10,4863-4868, (2010).
Kim, F. et al., Graphene oxide: Surface activity and two-dimensional assembly, Advanced Materials, 22 (2010) 1954-1958.
Kim, J. et al., Graphene oxide sheets at interfaces, Journal of the American Chemical Society, 132 (2010) 8180-8186.
Kong, D. et al., Temperature-Dependent Electrical Properties of Graphene Inkjet-Printed on Flexible Materials, Langmuir, ACS Publications, American Chemical Society, 28, (2012) pp. 13467-13472.
Lee, Y. et al., "Wafer-Scale Synthesis and Transfer of Graphene Films," Nano Letters 10 (2), 490-493 (2010).
Li, D. et al., Processable aqueous dispersions of graphene nanosheets, Nat Nano, 3 (2008) 101-105.
Li, X. et al., Large-Area Synthesis of High-Quality and Uniform Graphene Films on Copper Foils, Science, 324 (2009) 1312-1314.
Lin, Y. et al., "100-GHz Transistors from Wafer-Scale Epitaxial Graphene," Science, 327 (2010) p. 662.
Lin, Y. et al., "Wafer-Scale Graphene Integrated Circuit," Science 332 (6035), 1294-1297 (2011).
Luo, J. et al., Compression and Aggregation-Resistant Particles of Crumpled Soft Sheets, ACS Nano, 5 (2011) 8943-8949.
Luo, J. et al., Graphene oxide nanocolloids, Journal of the American Chemical Society, 132 (2010) pp. 17667-17669.
Novoselov, K. et al., Electric Field Effect in Atomically Thin Carbon Films, Science, 306 (2004) pp. 666-669.
Park, J. et al., Multi-scale graphene patterns on arbitrary substrates via laser-assisted transfer-printing process, Applied Physics Letters, vol. 101, No. 4, (2012) p. 043110-043110-4.
Park, S. et al., Chemical methods for the production of graphenes, Nat Nano, 4 (2009) 217-224.
Shao, G. et al., Graphene oxide: The mechanisms of oxidation and exfoliation, Journal of Materials Science, 47 (2012) 4400-4409.
Stankovich, S. et al., Synthesis of graphene-based nanosheets via chemical reduction of exfoliated graphite oxide, Carbon, 45 (2007) 1558-1565.
Stoller, M. et al., Graphene-Based ultracapacitors; Nano Letters, 8 (2008) 3498-3502.

(56) References Cited

OTHER PUBLICATIONS

Torrisi, F. et al., Inkjet-Printed Graphene Electronics, ACS Nano, vol. 6, No. 4, (2012) 2992-3006.

Wu, Z.S. et al., Graphene/metal oxide composite electrode materials for energy storage, Nano Energy, 1 (2012) 107-131.

Zangmeister, C.D., Preparation and evaluation of graphite oxide reduced at 220 c, Chemistry of Materials, 22 (2010) 5625-5629.

Zhang, Y. et al., Cytotoxicity effects of graphene and single-wall carbon nanotubes in neural phaeochromocytoma-derived pc12 cells, ACS Nano, 4 (2010) 3181-3186.

Zhang, Y. et al., "Direct imprinting of microcircuits on graphene oxides film by femtosecond laser reduction," Nano Today, vol. 5, (2010) pp. 15-20.

Zhu, Y. et al., Carbon-Based Supercapacitors Produced by Activation of Graphene; Science, 332 (2011) 1537-1541.

Havener, R. et al., Hyperspectral Imaging of Structure and composition in Atomically Thin Heterostructures; ACS Nano, 13 (2013) 3942-3946.

Ko, S. et al., Unconventional, Laser Based OLED Material Direct Patterning and Transfer Method; Organic Light Emitting Diode—Material, Process and Devices; Intech, ISBN: 978-953-307-273-9.

Lee, K. et al., Effect of Laser Beam Trajectory on Donor Plate in Laser Induced Thermal Printing Process; Journal of the Optical Society of Korea, vol. 15, No. 4, Dec. 2011, pp. 362-367.

Cho, S. et al., Enhanced efficiency of organic light emitting devices (OLEDs) by control of laser imaging condition; Organic Electronics 13 (2012) 833-839.

Olivares-Marín, M. et al., Cherry stones as precursor of activated carbons for supercapacitors; Materials Chemistry and Physics 114, 1, (2009) 223-227.

Jang, B.Z. et al., Processing of nanographene platelets (NGPs) and NGP nanocomposites: a review; Journal of Materials Science 43, 5092-5101, (2008).

\* cited by examiner

INKJET-PRINTED FLEXIBLE ELECTRONIC COMPONENTS FROM GRAPHENE OXIDE

CROSS-REFERENCE TO RELATED APPLICATIONS

The present application is a divisional of U.S. patent application Ser. No. 13/301,124, filed on Nov. 21, 2011, and claims the benefit of U.S. Provisional Patent Application No. 61/416,062, filed on Nov. 22, 2010, both of which are incorporated by reference herein in their entireties.

STATEMENT REGARDING FEDERALLY SPONSORED RESEARCH

Certain technology disclosed herein was derived from research supported by the U.S. Government as part of Task Order #58, "Nano-RDX Self-Assembly for Multipoint Microinitiators," and Task Order #76, "Integrated Electronics and Energetics," of Contract W15QKN-05-D-0011. The invention described herein may be manufactured, used, and licensed by or for the U.S. Government for U.S. Government purposes.

BACKGROUND OF THE INVENTION

Continuing advances in miniaturizing electronic devices have resulted in an increased demand for rechargeable power sources that have long cycle life and can be rapidly charged. The life time of rechargeable batteries is limited to less than thousands of cycles due to the reduction-oxidation (redox) reactions which induce constant expansion-contraction of battery electrodes during charge/discharge cycles and consequently cause their deterioration over time. Also, with electrochemical energy stored in batteries delivered by the means of volumetric redox reactions, the charge/discharge rate and specific power of the best available lithium-ion batteries are limited by the slow rate of solid-state diffusion.

Electronic double-layer capacitors, commonly referred to as "supercapacitors", are promising prospects for overcoming the life-time and power-density limitations of present rechargeable batteries. These supercapacitors store energy by nanoscale charge separation at the electrode-electrolyte interface. This charge storage mechanism involves no chemical reaction with the electrodes, and consequently results in fast charge/discharge rates in seconds while being able to withstand millions of charge/discharge cycles.

In order to obtain high energy density, supercapacitor electrodes are generally fabricated from electrically conductive materials having the high surface areas necessary for charge separation and storage at the electrode-electrolyte interface. Carbonaceous materials such as activated carbon are most commonly used. Recently, there has been interest in exploring carbon nanotubes (CNT) and graphene as electrode materials because of their high theoretical surface areas of 1320 $m^2/g$ and 2630 $m^2/g$, respectively, and high electrical conductivity. CNT- and graphene-based supercapacitors have been demonstrated to possess high capacitance and fast charge/discharge characteristics. However, with regard to inkjet-printing these nanomaterials for practical applications, CNT and graphene suffer from: (1) high costs; (2) lack of commercial availability in large quantities, particularly for graphene; and, most importantly, (3) their tendency to aggregate in pure water due to their hydrophobic nature, even at very low concentrations of 5 ppm. The addition of surfactants can increase the stability of CNT and graphene dispersion, but most surfactants are found to have detrimental effects on capacitance.

SUMMARY OF THE INVENTION

The present invention provides inkjet-printed graphene electrodes comprising layered graphene flakes as an electrically-conductive medium. The present invention also provides flexible electrical components comprising such electrodes. The present invention also provides methods of fabricating such electrodes by inkjet-printing and subsequent thermal reduction of a water-based graphene oxide ink.

In an embodiment of the present invention, suitable graphene inks are prepared by suspending commercially available graphene oxide flakes (i.e., single molecular layers of graphene oxide) into pure water under ultrasonic conditions to form stable dispersions of graphene oxide flakes.

In other embodiments of the present invention, a graphene oxide ink is jetted using a commercial inkjet printer to deposit and pattern graphene oxide electrodes in any thickness, with minimum lateral resolutions of about 50 μm. According to embodiments of the present invention, graphene oxide can be printed on any of a variety of surfaces, including plastics, metal foils, and other materials. In some such embodiments, the printed graphene oxide is thermally reduced after printing at moderate temperatures in the range of about 140° C. to about 800° C. in an inert environment for a period of time in the range of about 4 hours to about 12 hours to increase the electrical conductivity of the printed graphene oxide electrode. In other such embodiments of the invention, the printed graphene oxide is photothermally reduced for a few minutes in air.

In some embodiments of the present invention, the power and energy densities of such inkjet-printed graphene electrodes are comparable to those of commercial activated carbon-based electrodes.

In some other embodiments of the present invention, the inkjet-printed graphene electrodes have porous structures with bi-modal pore size distribution. In some such embodiments the pore sizes are about 2 nm and about 20 nm.

In further embodiments of the invention, a graphene oxide ink is tailored by adding nanoparticles of materials such as metal nanoparticles, metal oxides nanoparticles or polymers to the ink to serve as conductivity enhancers, pseudo-capacitive materials and/or and physical nanospacers. Such additives are used to modify the electrical properties of the inkjet-printed graphene.

In yet further embodiments of the invention, the inkjet-printed graphene electrodes are incorporated into electronic components. In some such embodiments, the electronic components are supercapacitors. In some such embodiments, the electronic components are batteries. In some such embodiments, the electronic components are components of initiators for explosive devices. In some such embodiments, the electronic components are conductive spirals that mimic the two-dimensional ("2D") induction coils used in wireless transmitting technology.

In some embodiments of the invention, the spacing of the ink droplets is controlled during inkjet printing so as to produce functional graphene electrodes having selected degrees of transparency and/or sheet resistance. In some embodiments of the invention, such transparent electrodes are incorporated into solar cells or other optoelectronic devices.

BRIEF DESCRIPTION OF THE FIGURES

For a better understanding of the present invention, reference is made to the following detailed description of the exemplary embodiments considered in conjunction with the accompanying drawings, in which.

DETAILED DESCRIPTION OF THE INVENTION

The following detailed description of the invention includes a discussion of exemplary embodiments of inkjet-printed graphene electrodes, methods for producing such inkjet-printed graphene electrodes, and electronic devices incorporating such inkjet-printed graphene electrodes. It will be understood by those having ordinary skill in the relevant arts that many variations and modifications may be made to these exemplary embodiments without departing from the spirit and scope of the invention.

The recent development of methods for producing large quantities of hydrophilic graphene oxide at reasonable prices presents a unique opportunity for the use of graphene oxide as an ink for scalable inkjet-printing in terms of printing speed and process robustness. Just like graphene, graphene oxide has very high specific surface area. Although graphene oxide has a low electrical conductivity, it can be thermally or chemically reduced to increase electrical sheet conductance to levels comparable to those achieved with pristine graphene films. Therefore, it is anticipated that inkjet-printed and thermally reduced graphene oxide may serve as conformal, scalable and economically viable supercapacitor electrodes, particularly for flexible energy storage devices in miniature power applications, as well as other electronic components.

In a method of producing an inkjet-printed graphene according to an exemplary embodiment of the present invention, a commercially-available inkjet printer (i.e., a FUJIFILM Dimatix Materials Printer, DMP2800) was used to print and pattern graphene oxide from a graphene oxide ink onto a substrate in a controllable manner. Other makes and models of inkjet printers may be used in embodiments of the present invention.

The exemplary inkjet printer utilizes microfabricated piezoelectric nozzles for on-demand and programmable generation of 1 or 10 picoliter (pl) microscopic ink droplets with minimum spatial resolutions of about 20 to 50 µm. Each 10 pl droplet, upon hitting the substrate and drying, produces somewhat disc-shaped features with diameters of about 50 µm. The printing step can be repeated to increase thickness of the graphene layer.

Figure 1:
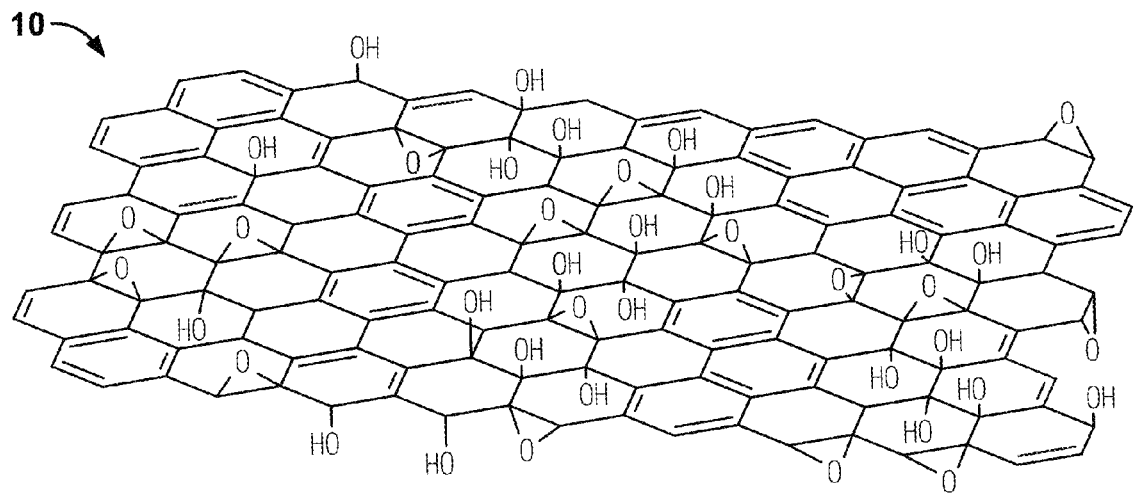
FIG. 1 is a diagram of a typical chemical structure of graphene oxide according to an embodiment in the prior art.
Figure 2:
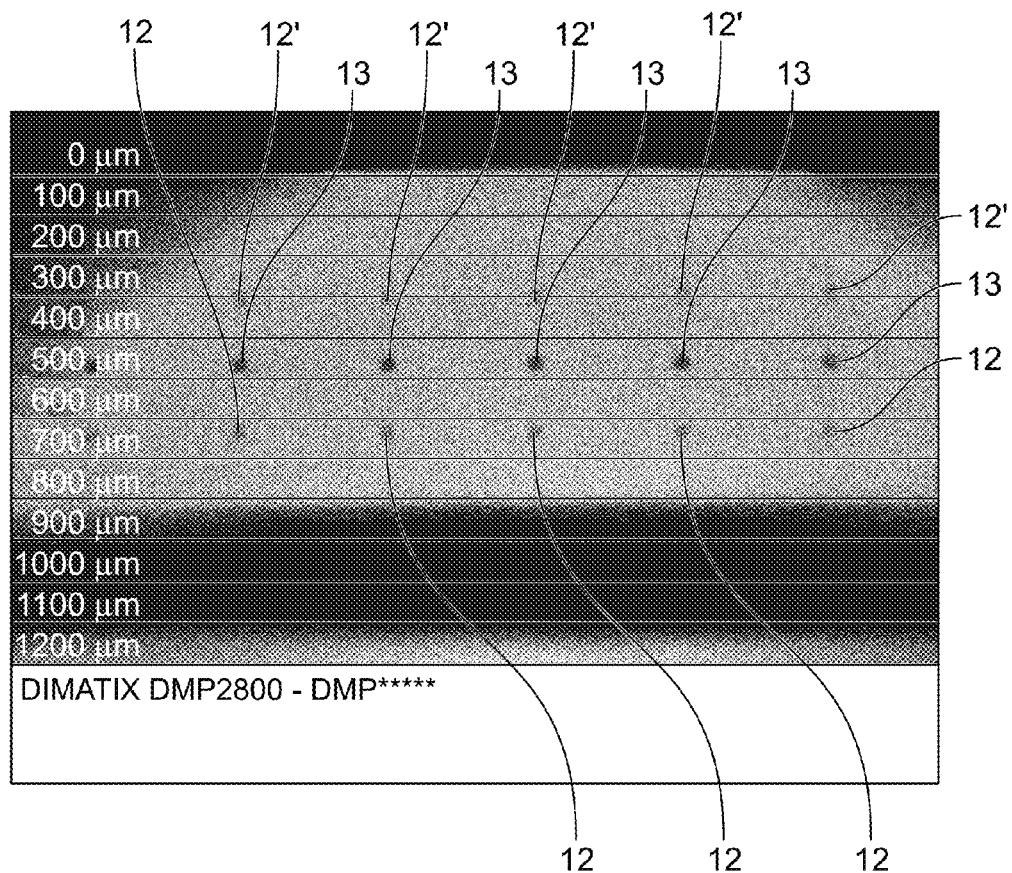
FIG. 2 is a microphotograph of spherical ink droplets deposited by a conventional inkjet printer according to a method of the present invention.

The graphene oxide ink used in the present example was prepared by suspending a commercially obtained graphene oxide (Cheaptubes, Inc., Brattleboro, Vt. 05301 USA) into pure water under ultrasonic conditions at a concentration of 0.2 wt %. The graphene oxide was in the form of single molecular layers (hereinafter referred to as "flakes") having lateral dimensions in the range of about 0.2 µm and 0.8 µm. An example of the structure of graphene oxide 10 is shown as FIG. 1. The water-based graphene oxide ink was stable for months, mostly due to the hydroxyl, epoxide and carboxyl (not shown) functional groups naturally present on the surface of graphene oxide. Water-based inks having up to 1 wt % graphene oxide may also be used, but stability decreases at higher graphene oxide concentrations. At room temperature, the viscosity and surface tension of the 0.2 wt % water-based graphene oxide ink were measured to be 1.06 mPa·s and 72 mN/m, similar to those of deionized water (e.g., 0.99 mPa·s and 72 mN/m). These properties of the ink were outside of the ranges of recommended for normal inkjet printing (e.g., 10-12 mPa·s and 28-32 mN/m). However, after routine experimentation with the voltage of the piezoelectric nozzles of the inkjet printer as a function of time, the inkjet process was effective in consistently generating and printing spherical ink droplets at a lateral spatial resolution of about 50 µm, without clogging the nozzles. FIG. 2 shows such ink droplets 12, their images 12' reflected in a substrate, and images 13 of the inkjet nozzle. The droplets 12 were repeatedly deposited at precise locations. For example, FIGS. 3 and 4 show inkjet-printed graphene oxide dots 14 that were deposited using 20 printing passes.

Figure 3:
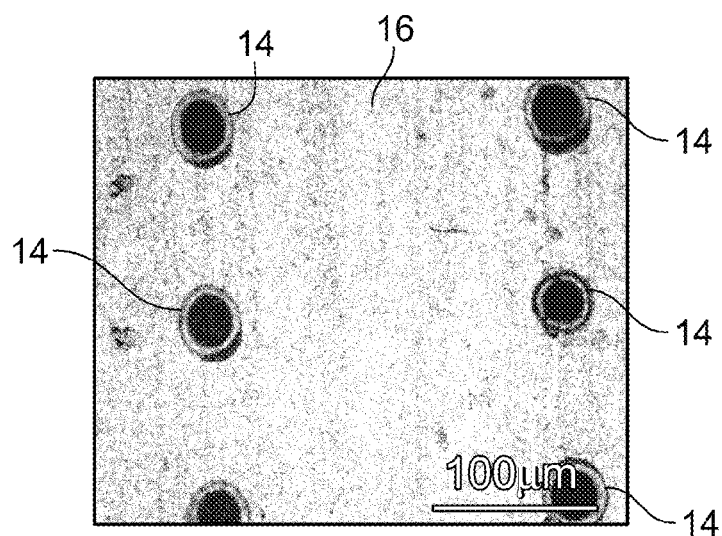
FIG. 3 is a microphotograph of graphene oxide dots formed on a substrate by evaporation of solvent from ink drops deposited by a conventional inkjet printer according to a method of the present invention.
Figure 4:
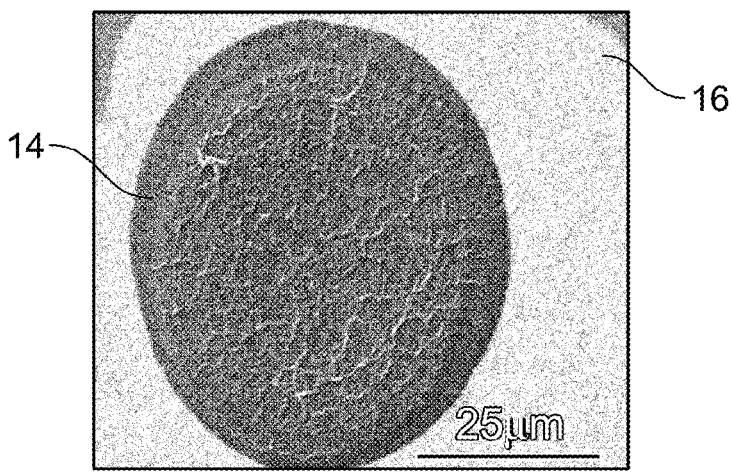
FIG. 4 is an enlargement of a portion of FIG. 3 showing the scale of one graphene oxide dot of the type shown in FIG. 3.
Figure 5:
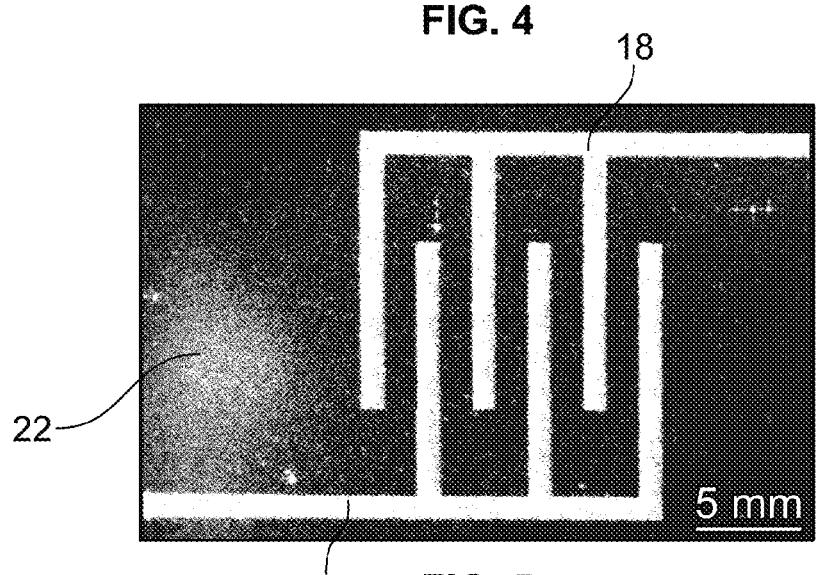
FIG. 5 is a microphotograph of two exemplary inkjet-printed graphene electrodes on a substrate according to an embodiment of the present invention.

Continuing to refer to FIGS. 3 and 4, each graphene oxide dot 14 is a disc-shaped micropattern feature formed by the liquid ink droplet upon hitting the substrate 16 and losing solvent by evaporation. In exemplary embodiments of the present invention, and as illustrated in FIG. 5, such droplets were overlapped to: (1) produce a cross-finger, interdigitated configuration of two graphene oxide electrodes 18, 20 on a flexible polymer substrate 22 (Kapton® polyimide film, E. I. du Pont de Nemours and Company, USA) and (2) highlight lateral pattern resolutions at the micron length scales. Such an electrode configuration is suitable for fabrication of supercapacitors. Graphene oxide electrodes, such as electrodes 18, 20 and electrodes having other shapes and thicknesses, can be inkjet-printed on any substrate surface, including Kapton®, silver, silicon, nickel, and titanium, depending on the electrical, mechanical or chemical properties desired. The pattern thickness can be increased, if necessary, by repeating the number of printing passes so as to overlay droplets according to the pattern. The lateral resolution of the patterns shown in FIG. 5 was about 50 µm. The thickness of the graphene oxide deposit can also be controlled by varying droplet sizes and lateral spacing of the droplets.

In a demonstration of the performance of inkjet-printed graphene electrodes of the present invention, graphene oxide was inkjet-printed onto a titanium (Ti) substrate using 100 printing passes. The inkjet-printed graphene oxide printed on the Ti foil was then reduced at 200° C. in $N_2$ atmosphere for 12 hours to increase the electrical conductivity of the printed material. The printed graphene oxide electrode transitioned from electrically insulating to electrically conducting, as measured by a voltmeter, after the reduction step.

The temperature and time of the reduction process should be selected to be compatible with the substrate material and other conformal materials to be used in fabricating the flexible electronic components. The degree of thermal reduction may also be tuned to achieve the desired specific capacitance through control of the functional groups attached to the graphene oxide flake and through the wetting properties of the graphene ink. Transitions from electrically-insulating graphene oxide to electrically-conducting graphene are also observed after photothermal reduction of the graphene oxide. Such photothermal reduction can be achieved by irradiating the inkjet-printed graphene oxide for a few minutes in air with a simple infrared heat lamp of a type commonly available at a retail hardware store.

Figure 6:
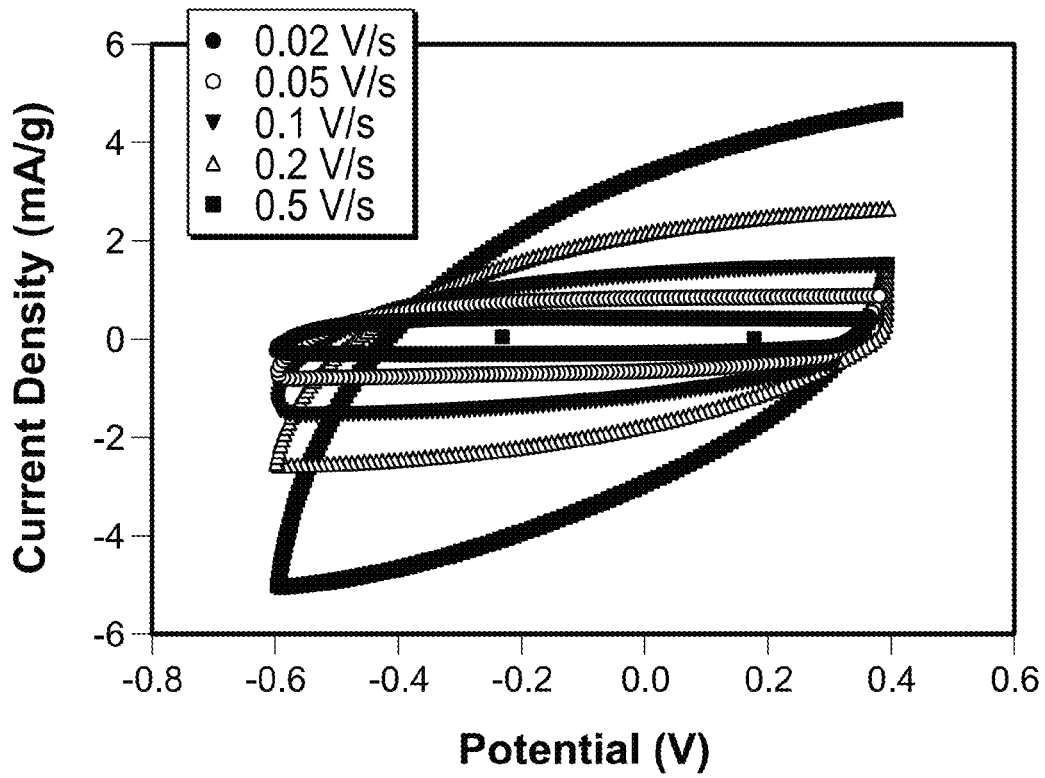
FIG. 6 is a cyclic voltammetry plot of the current density/potential function of two clamped inkjet-printed graphene electrodes on a substrate according to another embodiment of the present invention.
Figure 7:
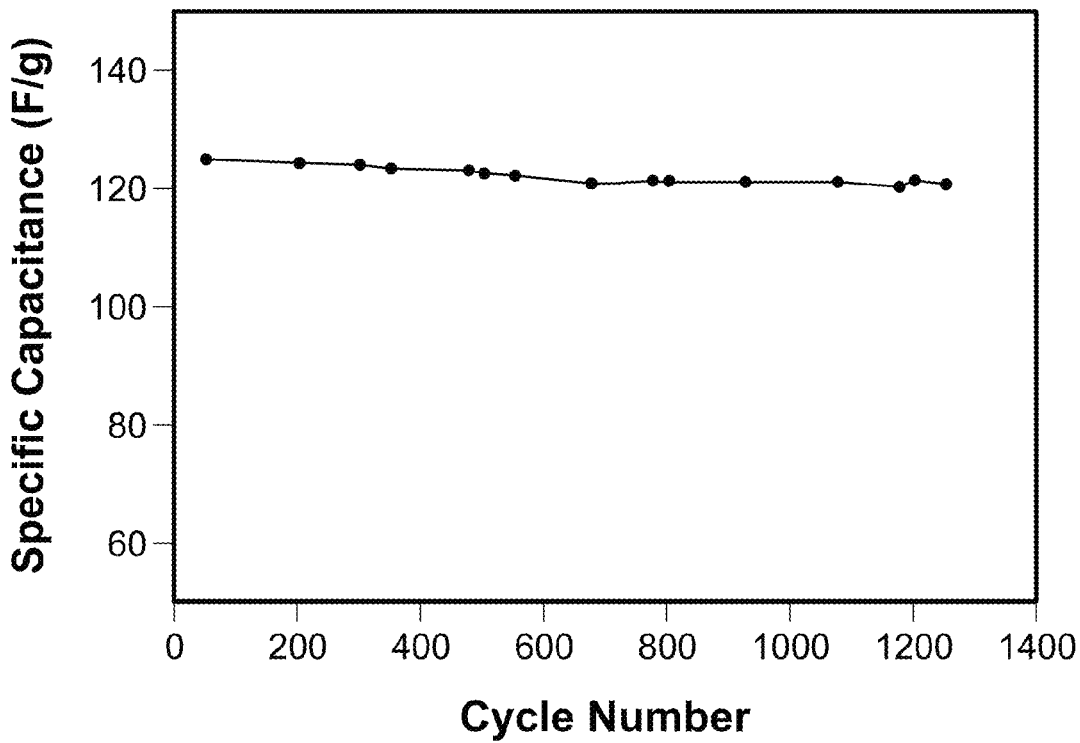
FIG. 7 is a plot of the specific capacitance of the electrodes of FIG. 6 against number of charge/discharge cycles.
Figure 8:
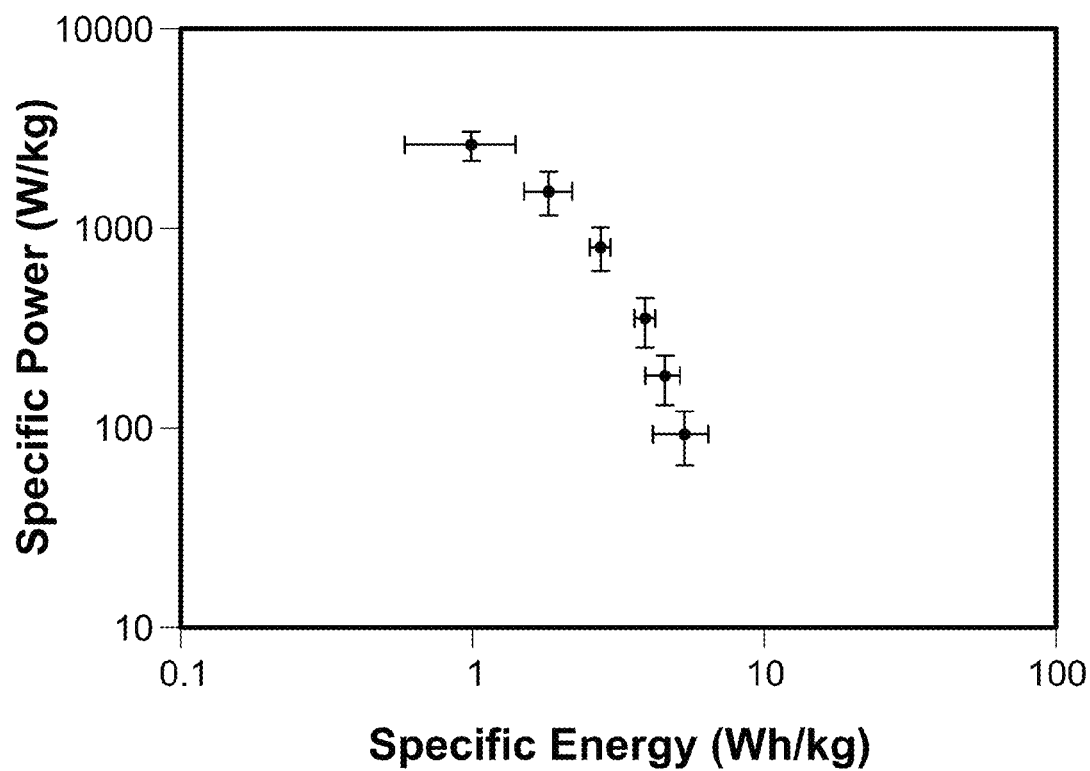
FIG. 8 is a Ragone plot of the specific power against the specific energy of the electrodes of FIG. 6.

After thermal reduction, the graphene electrodes on Ti were clamped in a block of Teflon® fluoropolymer (E.I. duPont de Nemours and Company, USA) using a Celgard 3401® (Celgard, LLC, Charlotte, N.C. 28273 USA) membrane as a separator and 1 M $H_2SO_4$ electrolyte in order to make cyclic voltammetry (CV) and constant-current charge/discharge measurements as a full-cell, although unpackaged, device. As shown in FIG. 6, the graphene electrodes exhibited fairly rectangular CV curves at scan rates in the range of 0.01 to 0.5 V/s, showing capacitive behavior. The specific capacitance decreased from 126 to 120 F/g over 1000 CV cycles at a constant scan rate of 50 mV/s (FIG. 7) demonstrating 95% capacitance retention. The charging/discharging curves were fairly linear (not shown). This capacitance compares well with those reported for other carbonaceous electrode materials such as carbon nanotubes, CVD graphene and activated carbon. Also, the specific capacitance was measured to be 48 to 132 F/g in the scan range of 0.5 to 0.01 V/s (not shown). The discharge slopes of the charge/discharge curves were used to estimate the specific energy and power density (per graphene mass only) shown in the Rangone plot (FIG. 8). A comparison of selected properties of graphene made by powder methods and printed graphene is presented in Table 1, below.

TABLE 1

Performance of Graphene from Two Sources

|  | Graphene (powder methods) | Printed Graphene |
|---|---|---|
| Capacitance (F/g) | about 100 about 117 | 132 |
| Energy Density (Wh/kg) | 4.1 | 6.74 |
| Power Density (kW/kg) | 10 | 2.19 |

The electrical properties of the inkjet-printed graphene electrode, including power and energy densities, may be further improved by modifying the graphene oxide ink with nanoparticles that can serve as conductivity enhancers and/or physical spacers in the electrode. These nanoparticles may also contribute energy storage through pseudocapacitance. Such materials may include metal oxides or electrically-conductive organic polymers, among others. For example, a water-based graphene oxide ink, as disclosed above, was modified by addition of ruthenium oxide ($RuO_2$) nanoparticles. A suspension of such nanoparticles was prepared using a simple solution-based precipitation method in which a KOH solution was added to a $RuCl_3$ solution with a stabilizing agent to reach a pH value of 7. The size of the $RuO_2$ nanoparticles was about 10 nm and was tunable by controlling synthesis conditions. The suspension was able to pass a 450 nm filter and was stable due to the high surface ζ-potential of the $RuO_2$ nanoparticles. By mixing the graphene oxide suspension and the $RuO_2$ nanoparticle suspension at an appropriate ratio, a stable ink containing both graphene oxide and $RuO_2$ was formulated. Appropriate ratios and sizes of the $RuO_2$ nanoparticles may be determined experimentally to achieve desirable electrode properties. The graphene oxide-$RuO_2$ ink was printable, and was used to fabricate a graphene+$RuO_2$ composite electrode on a nickel (Ni) foil using a printing and reduction method disclosed above. In the electrode, the $RuO_2$ nanoparticles served as physical spacers to keep the molecular layers of graphene oxide open, increasing the porosity of the graphene element and access for electrolyte ions. Ruthenium oxide is also a well known pseudocapacitive material. In comparison to the graphene printed on Ni, the graphene oxide+$RuO_2$ electrode increased both the surface area and capacitance of the graphene by a factor of about two, as summarized in Table 2 below. These results demonstrate the effectiveness of adding the $RuO_2$ nanoparticles to increase the electrochemical performance of the inkjet-printed graphene electrode. Other spacers, such as other metal nanoparticles, metal oxides nanoparticles or electrically-conductive organic polymers, may also be added to the graphene oxide ink to increase the porosity and/or pseudocapacitance of the finished graphene electrode.

TABLE 2

Comparison of Physical Properties of Inkjet-Printed Graphene from Two Different Water-Based Inks

|  | Graphene with $RuO_2$ nanoparticles | Graphene without $RuO^2$ nanoparticles |
|---|---|---|
| Surface area ($m^2$/g) | 432 | 178 |
| Specific capacitance (F/g) | 26 | 13 |

Figure 9:
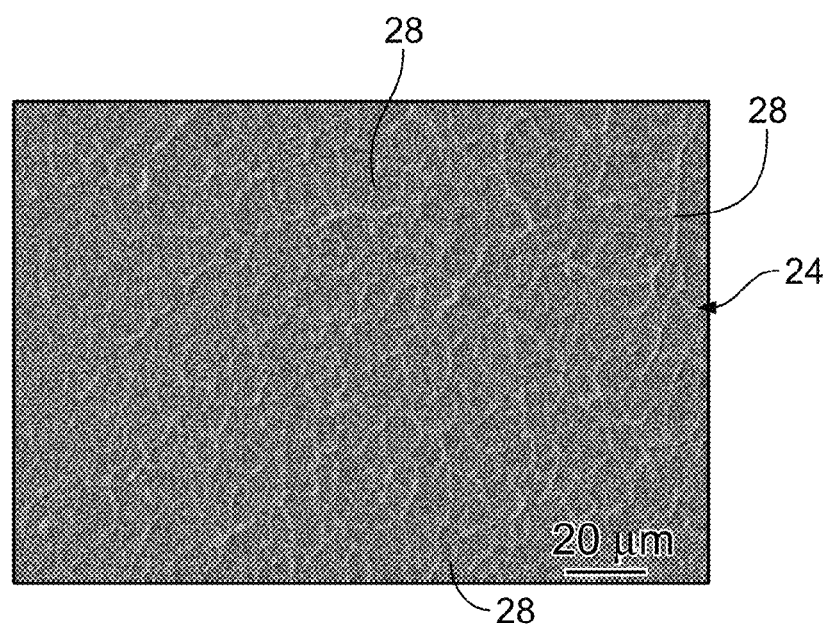
FIG. 9 is a scanning electron microscopic graph (SEM) of the top surface of a 100-pass inkjet-printed graphene structure showing corrugations in the graphene structure made according to an embodiment of the present invention.
Figure 10:
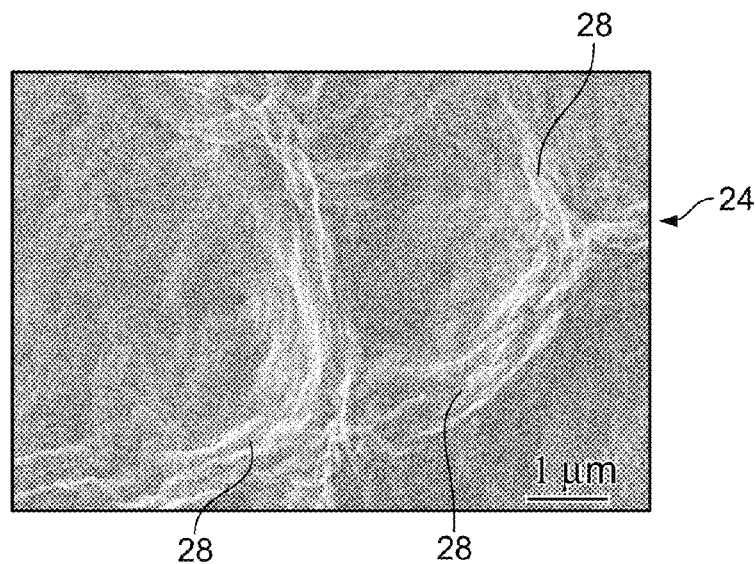
FIG. 10 is an enlargement of a portion of the SEM of FIG. 9.
Figure 11:
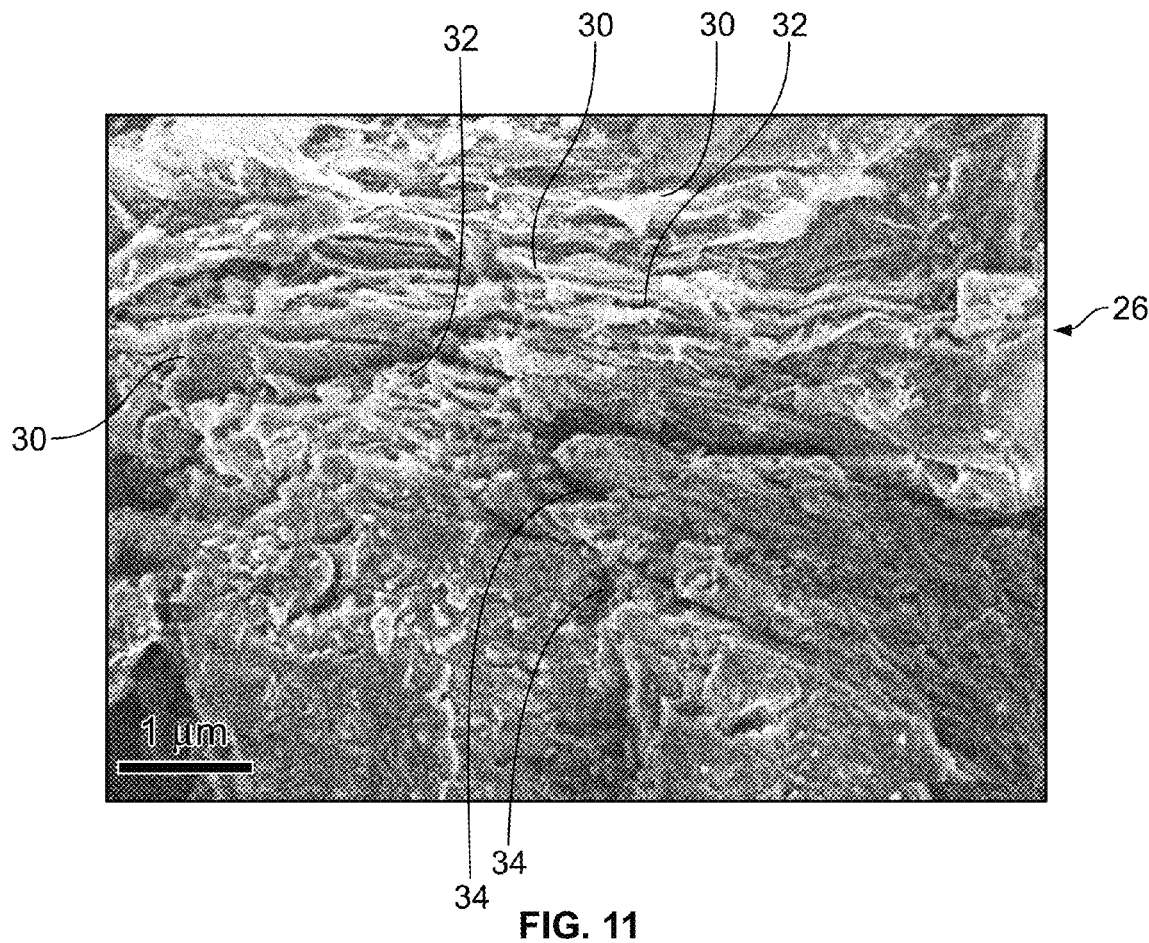
FIG. 11 is a SEM of a cross-section of a 100-pass inkjet-printed graphene structure made according to an embodiment of the present invention, showing porous and layered structures.

The inkjet-printed graphene of the present invention has an inherent porosity that may be a result of the manner in which the graphene structures are assembled (i.e., by overlapping graphene oxide dots or droplets). FIGS. 9, 10 and 11 are SEM images of 100-pass inkjet-printed graphene structures 24, 26. FIGS. 9 and 10 are top planar views of a 100-pass structure 24 at scales of 20 μm and 1 μm, respectively, showing corrugations 28. FIG. 11 is a cross-sectional view of a 100-pass structure 26 showing graphene layers, such as graphene layers 30, and micropores and mesopores, such as micropores 32 and mesopores 34, associated with corrugations. Without intending to be bound by theory, corrugations may be formed by folding and overlapping of the graphene oxide flakes when the ink droplets are deposited and dried, or by deformation of the layers as graphene oxide is reduced to graphene during the thermal or photothermal reduction step.

Figure 12:
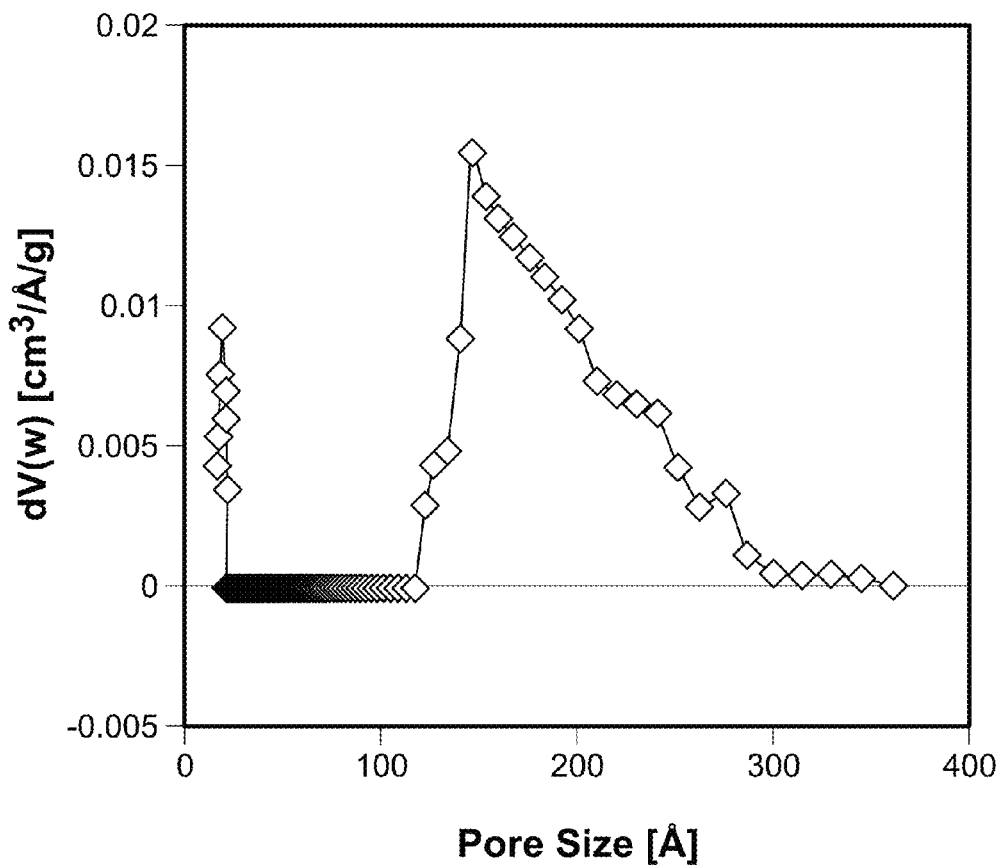
FIG. 12 is a plot of the pore size distribution in a 100-pass inkjet-printed graphene structure made according to an embodiment of the present invention.

Porosity analysis of 100-pass inkjet-printed graphene structures, which did not include additional nanoparticles, revealed that the structures were highly porous and had a bimodal distribution of pores, divided into micropores having sizes of about 1.5-2.2 nm and mesopores having sizes of about 11-36 nm. FIG. 12 is a plot of the pore size distribution. It may be noted that the ranges of pore sizes are rather narrow. The distribution of surface area and specific volume of the graphene structures among the types of pores is summarized in Table 3, below. Analyses were performed using standard methods, including nitrogen isotherm adsorption and BET methods for surface area estimates and the BJH model for pore size distribution analysis. As discussed above, increasing the porosity of the graphene structures can be used to improve their power and energy density. One method (i.e., the addition of spacers to the ink) was discussed above. Another method is to etch the graphene structure with a caustic reagent (e.g., potassium hydroxide (KOH) solution).

TABLE 3

Distribution of Surface Area and Volume Relative to Pore Size

|  | Total | Micropores (1.5-2.2 nm) | Mesopores (11-36 nm) |
| --- | --- | --- | --- |
| Surface area ($m^2/g$) | 282 | 140 | 142 |
| Volume ($cm^3/g$) | 1.36 | 0.0846 | 1.27 |

Figure 13:
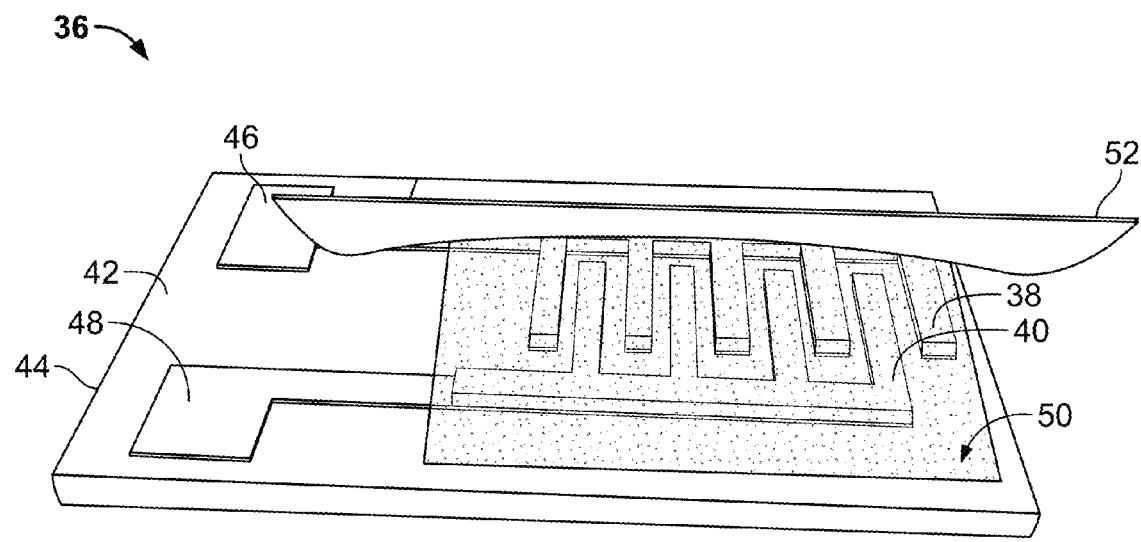
FIG. 13 is a schematic diagram of a conceptual design for a supercapacitor having inkjet-printed graphene electrodes, according to an embodiment of the present invention.

As demonstrated by the foregoing exemplary embodiments of the invention, inkjet-printed graphene has properties useful in fabricating electrical components having high capacitance. A schematic of an exemplary embodiment of a supercapacitor 36 having inkjet-printed graphene electrodes 38, 40 is presented in FIG. 13. Referring to FIG. 13, graphene electrodes 38, 40 are inkjet-printed on the surface 42 of an electrically insulating material 44 (e.g., Kapton® polyimide membrane) in a cross-finger, interdigitated configuration. Polymeric membranes are often hydrophobic, and may resist adhesion of the water-based graphene oxide ink disclosed herein. In such cases, the membrane may be pretreated to improve the adhesion and wetting behavior of the ink droplets. For example, the Kapton® polyimide membrane may be pretreated with a caustic reagent (e.g., KOH solution) to improve adhesion and wetting behavior of the ink. Current collectors 46, 48 may also be applied to the surface 42 in electrical contact with the electrodes 38, 40. The current collectors 46, 48 are formed from an electrically-conductive material (e.g. silver (Ag)) and may be applied as a suspension of nanoparticles. Suitable suspensions are commercially available for this purpose. A quantity of electrolyte 50 is applied to the electrodes 38, 40 and enclosed by a hermetic seal 52. A suitable seal may be formed from a polymeric membrane (e.g., Kapton® FN polyimide film, E.I. duPont de Nemours and Company, USA) that is heat-sealed sealed to the electrically-insulating material 44. Adhesive bonding (e.g., by soft-lithographic techniques) may also form a suitable seal. The materials used for the supercapacitor 36 must be electrochemically compatible with each other. Methods of selecting suitable materials will be known to those having ordinary skill in the design of electrochemical devices, who are given the present disclosure.

Electronic components, such as the supercapacitor discussed above, will generally be mechanically flexible, with the flexibility limited primarily by the structure encapsulating the electrodes. The graphene electrodes are thin and durable, and flex readily without losing their structural integrity. They can be printed on or conformed to surfaces other than those that are flat.

By modifying the inkjet printing conditions, the morphology and properties of the printed electrodes can be tailored for applications other than supercapacitors. For example, at a resolution of 50 µm, inkjet-printing can be used to create a conductive spiral that mimics the two-dimensional ("2D") induction coils used in wireless transmitting technology.

Transparent inkjet-printed graphene films can be made for use in solar cells and optoelectronic devices as substitutes for conventional transparent materials such as indium tin oxide. If ink droplets are overlapped to form a single printed layer thin film without building up thickness of the printed pattern, graphene structures are formed that are transparent and electrically conductive. By varying the degree of overlap, which is a result of droplet size and spacing, and the thickness of the printed structure, which can be controlled by the number of printed layers, the properties of the thin graphene film can be tailored for different purposes. Data showing the result of varying droplet spacing on the sheet resistance and transparency of five printed-layered films are presented in Table 4, below.

TABLE 4

Effect of Droplet Spacing on the Properties of a 5 printed-layered Graphene Film

| Droplet Spacing (µm) | Sheet Resistance (MΩ/□) | Transparency (%) |
| --- | --- | --- |
| 20 | 0.3 | 78 |
| 30 | 3.1 | 85 |
| 40 | 5.5 | 93 |

It should be understood that the embodiments of the invention described herein are merely exemplary and that a person skilled in the art may make many variations and modifications without departing from the spirit and scope of the invention. All such variations and modifications are intended to be included within the scope of the invention as defined in the appended claims.

We claim:

1. A capacitor, comprising
a first inkjet-printed electrode formed on a surface of a substrate, said first electrode including a first plurality of overlapping dot-like structures which include graphene flakes;
a second inkjet-printed electrode formed on said surface of said substrate, said second electrode including a second plurality of overlapping dot-like structures which include graphene flakes, wherein said first and second electrodes have a fingered geometry and are spaced away from each other in a cross-finger interdigitated arrangement.

2. The capacitor of claim 1, further comprising first and second current collectors, wherein said first and second electrodes are respectively in contact with said first and second current collectors.

3. The capacitor of claim 2, wherein said first and second electrodes and an electrolyte are packaged together by a hermetic seal, said first and second current collectors being exposed outside of said hermetic seal.

4. The capacitor of claim 1, wherein said first and second electrodes are formed by a process including the steps of depositing graphene oxide flakes in droplets of liquid onto said surface of said substrate so as to form said overlapping dot-like structures which include said graphene oxide flakes, and then reducing at least some of said graphene oxide flakes so to convert them to graphene flakes, thereby making said first and second electrodes electrically conductive.

* * * * *